(12) United States Patent
Laury

(10) Patent No.: US 10,985,723 B2
(45) Date of Patent: Apr. 20, 2021

(54) ELECTRONIC DEVICE AND METHOD FOR RECEIVING A RADIO SIGNAL, INTEGRATED CIRCUIT IMPLEMENTING SUCH A DEVICE

(71) Applicant: PARROT FAURECIA AUTOMOTIVE SAS, Paris (FR)

(72) Inventor: Cyril Laury, Antony (FR)

(73) Assignee: Faurecia Clarion Electronics Europe, Paris (FR)

( * ) Notice: Subject to any disclaimer, the term of this patent is extended or adjusted under 35 U.S.C. 154(b) by 0 days.

(21) Appl. No.: 16/676,113

(22) Filed: Nov. 6, 2019

(65) Prior Publication Data
US 2020/0144980 A1 May 7, 2020

(30) Foreign Application Priority Data
Nov. 6, 2018 (FR) ...................... 18 60197

(51) Int. Cl.
*H03G 3/30* (2006.01)
*H04B 1/06* (2006.01)
*H04B 1/16* (2006.01)

(52) U.S. Cl.
CPC ............. *H03G 3/3078* (2013.01); *H04B 1/16* (2013.01)

(58) Field of Classification Search
CPC combination set(s) only.
See application file for complete search history.

(56) References Cited

U.S. PATENT DOCUMENTS

| 5,107,225 | A | 4/1992 | Wheatley, III et al. |
| 6,134,430 | A | 10/2000 | Younis et al. |
| 6,208,849 | B1 | 3/2001 | Cho et al. |
| 6,489,847 | B1 * | 12/2002 | van Zeijl ............... H03F 3/3001 330/255 |
| 6,670,901 | B2 * | 12/2003 | Brueske ............... H03G 3/3052 341/139 |
| 7,120,410 | B2 * | 10/2006 | Shi ........................... H03F 1/32 455/226.2 |
| 7,299,021 | B2 * | 11/2007 | Pärssinen et al. ..... H04B 1/109 375/345 |
| 7,379,725 | B2 * | 5/2008 | Shi ........................... H03F 1/32 455/226.2 |

(Continued)

OTHER PUBLICATIONS

French Search Report corresponding to French application No. FR 1860197, dated Jun. 19, 2019, 2 pages.

*Primary Examiner* — Quochien B Vuong
(74) *Attorney, Agent, or Firm* — Reising Ethington P.C.

(57) ABSTRACT

An electronic device for receiving a radio signal includes an upstream amplifier configured to amplify a received radio signal, a control module configured to control a gain of the upstream amplifier, and a mixer connected at the output of the upstream amplifier and configured to mix the signal from the upstream amplifier with a reference signal. The control module is further configured to perform an intermodulation detection, by commanding the generation by the upstream amplifier of a gain increase and comparing a first power with a second power, the first and second powers being respective powers of a signal at the output of the mixer, the first power being measured in the absence of gain increase and the second power being measured in the presence of the gain increase.

13 Claims, 2 Drawing Sheets

(56) References Cited

U.S. PATENT DOCUMENTS

| | | | |
|---|---|---|---|
| 7,426,376 B2 * | 9/2008 | Srinivasan | H04B 1/109 |
| | | | 455/136 |
| 7,551,238 B2 * | 6/2009 | Motte | H03G 1/0088 |
| | | | 348/528 |
| 9,281,792 B2 * | 3/2016 | Matsui | H04L 27/2649 |
| 9,641,128 B2 * | 5/2017 | Yang | H03F 1/305 |
| 2003/0181180 A1 | 11/2003 | Darabi et al. | |
| 2004/0043733 A1 | 3/2004 | Marrah et al. | |
| 2005/0277395 A1 | 12/2005 | Lo Hine Tong et al. | |
| 2008/0102773 A1 | 5/2008 | Buchwald et al. | |
| 2008/0153447 A1 | 6/2008 | Cowley et al. | |

* cited by examiner

ELECTRONIC DEVICE AND METHOD FOR RECEIVING A RADIO SIGNAL, INTEGRATED CIRCUIT IMPLEMENTING SUCH A DEVICE

CROSS-REFERENCE TO RELATED APPLICATIONS

This application is a U.S. non-provisional application claiming the benefit of French Application No. 18 60197, filed on Nov. 6, 2018, which is incorporated herein by reference in its entirety.

TECHNICAL FIELD

The present invention relates to an electronic device for receiving a radio signal, the device comprising an upstream amplifier configured to amplify a received radio signal, a control module configured to control a gain of the upstream amplifier and a mixer, connected at the output of the upstream amplifier, the mixer being configured to mix the signal from the upstream amplifier with a reference signal.

The invention also relates to an integrated circuit implementing such an electronic device for receiving a radio signal.

The invention also relates to a method for receiving a radio signal, the method being implemented by such an electronic reception device.

The invention relates to the field of tuners, that is to say, electronic apparatuses making it possible to receive an electromagnetic signal emitted in a frequency band, to keep the part of the signal emitted on a particular frequency band, also called effective frequency, and to reject the parts of the signal emitted on the other frequencies. The invention more particularly relates to analog tuners, irrespective of the concerned range of radio waves. The invention for example relates to radio tuners, such as FM (Frequency Modulation), AM (Amplitude Modulation), DAB (Digital Audio Broadcasting) or HD Radio tuners. The invention also relates to TV tuners, such as DVB-T (Digital Video Broadcasting-Terrestrial), DVB-T 2, ISDB-T/Tsb (Integrated Services Digital Broadcasting-Terrestrial/Terrestrial Sound Broadcast) or CTTB (China Terrestrial Television Broadcasting) tuners.

BACKGROUND

An electronic reception device of the aforementioned type is known from document US 2004/0043733 A1. The reception device comprises an upstream amplifier amplifying a radio signal received via an antenna, a WBAGC (Wide Band Automatic Gain Control) module for controlling the gain of the upstream amplifier, and a mixer connected at the output of the upstream amplifier and mixing the signal from the upstream amplifier with another signal. This reception device further comprises a downstream amplifier connected at the output of the mixer and an intermodulation detector capable of detecting an intermodulation from the signal delivered by the downstream amplifier, and generating, if applicable, an intermodulation indicator, intended for the WBAGC control module, so that the latter next adapts the gain of the upstream amplifier as a function of any detected intermodulation. The reception device is a reception device for FM radio signals, and the intermodulation detector detects an intermodulation from major frequency variations beyond standard FM deviations and associated noise resulting from broad frequency spectrums.

Document US 2008/0102773 A1 also relates to an electronic reception device of the aforementioned type. It comprises an upstream amplifier amplifying a radio signal received from an antenna, a gain controller controlling the gain of the upstream amplifier, a mixer connected at the output of the upstream amplifier and mixing the signal from the upstream amplifier with another signal, a downstream amplifier connected at the output of the mixer and an analog to digital converter connected at the output of the downstream amplifier. The reception device further comprises a detector of intermodulation products from the signal coming from the analog-to-digital converter, the gain controller then being suitable for modifying the gain of the upstream amplifier as a function of the detection or non-detection of such intermodulation products. The intermodulation products are for example detected via a variation rate of the increase of the noise in one or several channels adjacent to the channel conveying the radio signal, or by directly detecting these intermodulation products on a guard band comprising part of the channel transporting the radio signal.

Document US 2008/0153447 A1 also describes an electronic reception device of the aforementioned type. This reception device comprises a variable gain amplifier amplifying a received radio signal, a controller of the gain of the amplifier and a mixer connected at the output of the amplifier and mixing the signal from the amplifier with another signal. The reception device further comprises a downstream detector connected at the output of the mixer and an upstream detector connected at the input of the mixer, the upstream and downstream detectors being suitable for detecting interference, and in particular an intermodulation phenomenon, the connected downstream detector detecting whether an interfering signal is present on an adjacent frequency at 6 MHz from the effective frequency, corresponding to an offset of N+1, and the upstream detector detecting whether an interfering signal is present on an adjacent frequency beyond 6 MHz from the effective frequency, typically at 18 MHz from the frequency of the effective signal corresponding to an offset N+3. The controller then adapts the gain of the amplifier as a function of whether an intermodulation is detected.

However, with such reception devices, the detection of an intermodulation is relatively complex, and in some cases requires several detectors.

SUMMARY

An aim of the invention is then to provide an electronic device for receiving a radio signal making it possible to detect an intermodulation more easily.

To that end, the invention relates to an electronic reception device for receiving a radio signal, the device comprising:
  an upstream amplifier configured to amplify a received radio signal,
  a control module configured to control a gain of the upstream amplifier, and
  a mixer, connected at the output of the upstream amplifier, the mixer being configured to mix the signal from the upstream amplifier with a reference signal,
  the control module being further configured to perform an intermodulation detection, by commanding the generation by the upstream amplifier of a gain increase and comparing a first power with a second power, the first and second powers being respective powers of a signal at the output of the mixer, the first power being measured in the absence of gain increase and the second power being measured in the presence of the gain increase.

With the electronic reception device according to at least some embodiments of the invention, the control module then makes it possible to perform a simple intermodulation detection, by commanding the generation of a gain increase at the upstream amplifier and comparing the first power measured in the absence of gain increase with the second power measured in the presence of the gain increase, the first and second powers being powers of the signal from the mixer.

In other words, with the electronic reception device, an intermodulation is detected when an increase in power, controlled by the control module and generated with the aim of performing this intermodulation detection, creates an abnormal variation of the power of the signal at the output of the mixer, in particular a nonlinear variation of this power.

According to other advantageous aspects of the invention, the electronic reception device comprises one or more of the following features, considered alone or according to all technically possible combinations:
- an intermodulation is detected if a difference between the second power and the first power is greater than substantially 1.5 times the gain increase;
- the control module is configured to repetitively command the generation of the gain increase;
- the time gap between a new gain increase and the last gain increase is increased in case of detection of an intermodulation after the last gain increase;
- the time gap between two successive gain increases preferably being substantially equal to 1 ms if no intermodulation has been detected after the last gain increase and if the gain of the upstream amplifier is smaller than a predefined upstream maximum gain;
- the device further comprises a downstream amplifier connected at the output of the mixer and an analog to digital converter connected downstream from the downstream amplifier;
- the analog to digital converter preferably being configured to measure the first and second powers;
- the control module is further configured, prior to an intermodulation detection, to perform a presence test of at least one adjacent stray signal, and then to perform the intermodulation detection only if the presence test is positive, said presence test depending on the power of the signal at the output of the mixer and the gain of the upstream amplifier;
- the presence test is positive if the gain of the upstream amplifier is below a predefined upstream maximum gain and if the power of the signal at the output of the mixer is strictly lower than a predefined target power;
- the presence test further depends on a gain of the downstream amplifier;
- the presence test preferably being positive if the gain of the upstream amplifier is below a predefined upstream maximum gain, if the gain of the downstream amplifier is substantially equal to a predefined downstream maximum gain and if the power of the signal at the output of the mixer is below a predefined target power;
- the device further comprises a first wideband detector connected between the output of the upstream amplifier and the control module; and the device further comprises a radio antenna able to receive a radio signal, and a second wideband detector connected between the radio antenna and the control module.

The invention also relates to an integrated circuit implementing an electronic device for receiving a radio signal, in which the device is as defined above.

The invention also relates to a method for receiving a radio signal, the method being implemented by an electronic reception device and comprising the steps consisting of:
- controlling a gain of an upstream amplifier,
- amplifying, via the upstream amplifier, a received radio signal,
- mixing the signal from the upstream amplifier with a reference signal, and
- performing an intermodulation detection, by commanding the generation by the upstream amplifier of a gain increase and comparing a first power with a second power, the first and second powers being respective powers of a signal at the output of the mixer, the first power being measured in the absence of gain increase and the second power being measured in the presence of the gain increase.

BRIEF DESCRIPTION OF THE DRAWINGS

These features and advantages of the invention will appear more clearly upon reading the following description, provided solely as a non-limiting example, and done in reference to the appended drawings, in which.

DETAILED DESCRIPTION

As used herein, the expression "substantially equal to" refers to an equality relationship to within plus or minus 10%, i.e., with a variation of no more than 10%; also preferably to an equality relationship to within plus or minus 5%, i.e., with a variation of no more than 5%.

Figure 1:
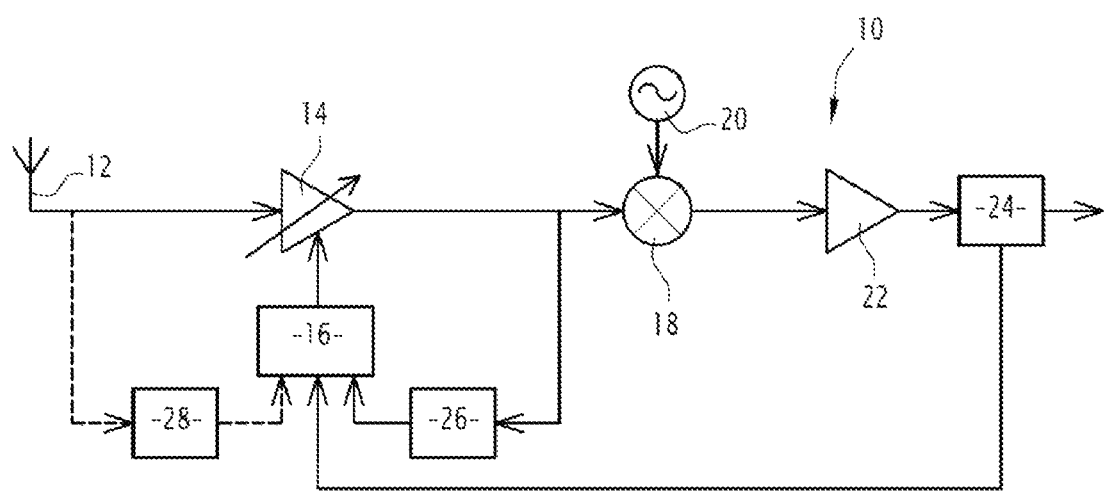
FIG. 1 is a schematic illustration of an electronic reception device according to an embodiment of the invention.

In FIG. 1, an electronic reception device 10 is configured to receive a radio signal. The electronic reception device 10 is typically a tuner, that is to say, an electronic apparatus making it possible to receive an electromagnetic signal emitted in a frequency band, to keep the part of the signal emitted on a particular frequency band, called effective frequency, and to reject the parts of the signal emitted on frequencies other than the effective frequency.

The electronic reception device 10 is for example an analog tuner configured to tune signals emitted in an analog manner, irrespective of the associated range of radio waves. The tuner is for example a radio tuner, such as an FM tuner able to receive a radio signal emitted in the range of frequencies between 87.5 MHz and 108 MHz; or an AM tuner able to receive a radio signal in the range of frequencies between 148.5 kHz and 283.5 kHz and/or between 526.5 kHz and 1606.5 kHz; or a DAB tuner; or an HD Radio tuner. In a variant, the tuner is a TV tuners such as a DVB-T tuner; or a DVB-T 2 tuner; or an ISDB-T tuner; or a CTTB tuner. The TV tuner is for example able to receive a radio signal emitted in the frequency range of between 40 MHz and 860 MHz.

The electronic reception device 10 comprises a radio antenna 12 able to receive a radio signal, an upstream amplifier 14 connected to the radio antenna 12 and configured to amplify the radio signal received by the antenna 12, the upstream amplifier 14 preferably being a variable gain amplifier (VGA) and as symbolized by the triangular amplification symbol in FIG. 1.

The electronic reception device 10 comprises a control module 16 configured to control a gain G of the upstream amplifier 14 and a mixer 18 connected at the output of the upstream amplifier 14, the mixer 18 being configured to mix the signal coming from the upstream amplifier 14 with a reference signal, such as a signal coming from an oscillator 20 to which the mixer 18 is then connected.

In addition, the electronic reception device 10 comprises a downstream amplifier 22 connected at the output of the mixer 18 and an analog to digital converter (ADC) 24, the analog to digital converter 24 being connected at the output of the downstream amplifier 22.

As an optional addition, the electronic reception device 10 comprises a first wideband detector (WBD) 26, connected between the output of the upstream amplifier 14 and the control module 16, the first wideband detector 26 being able to measure a power of the radio signal between the upstream amplifier 14 and the mixer 18, also called effective signal.

As another optional addition, the electronic reception device 10 comprises a second wideband detector 28 connected between the radio antenna 12 and the control module 16, the second wideband detector 28 being able to measure the power of the signal received by the antenna 12.

The electronic reception device 10 is for example made in the form of one or several dedicated integrated circuits, such as one or several ASICs (Application-Specific Integrated Circuit).

The radio antenna 12 is known in itself, and has a shape suitable for the range of radio waves capable of being received by the electronic reception device 10, whether it involves the radio range (AM, FM, DAB, HD Radio, ISDB-Tsb) or a TV range (DVB-T, DVB-T 2, ISDB-T, CTTB), previously described.

The upstream amplifier 14 is also known in itself, and has a gain G whose value is able to be controlled by the control module 16.

The control module 16 is further configured to perform an intermodulation detection, by commanding the generation by the upstream amplifier 14 of a gain increase $\Delta G$ and comparing a first power P1 with a second power P2. The first P1 and second P2 powers are respective powers of the signal at the output of the mixer 18, that is to say, of the signal coming from the mixer 18, the first power P1 being measured in the absence of gain increase of the upstream amplifier 14, and the second power P2 being measured in the presence of the gain increase $\Delta G$.

The first power P1 in the absence of gain increase refers to the power of the signal coming from the mixer 18, for example measured via the analog to digital converter 24, corresponding to the default gain of the upstream amplifier 14, without the gain increase $\Delta G$, for example to a nominal gain, denoted $G_{nom}$. According to this last example, the first power P1 is then also denoted $P(G_{nom})$, or $P_{ADC}(G_{nom})$ when it is measured via the analog to digital converter 24, also called ADC.

Second power P2 in the presence of gain increase $\Delta G$ refers to the power of the signal coming from the mixer 18, for example measured via the analog to digital converter 24, corresponding to the default gain of the upstream amplifier 14, further with the gain increase $\Delta G$, that is to say, corresponds to the sum of said default gain and the gain increase $\Delta G$. In the example where said default gain is the nominal gain $G_{nom}$, the second power P2 is then also denoted $P(G_{nom}+\Delta G)$, or $P_{ADC}(G_{nom}+\Delta G)$ when it is measured via the analog to digital converter 24, also called ADC.

The first and second powers P1, P2 are for example measured by the analog to digital converter 24, and the control module 16 is then connected to said analog to digital converter 24.

The control module 16 is for example configured to detect an intermodulation, that is to say, to consider that an intermodulation is present, if a difference between the second power P2 and the first power P1 is greater than substantially 1.5 times the gain increase $\Delta G$. In other words, in this example, when the first P1 and second P2 powers, as well as the gain increase $\Delta G$, are expressed in decibels, an intermodulation is detected if the difference between the second power P2 and the first power P1 is substantially greater than $\Delta G+2$ dB.

According to this example, an intermodulation is then detected if the following inequation is verified:

$$P2-P1 > \Delta G + 2 \text{ dB} \tag{1}$$

with $P1=P(G_{nom})$, for example $P1=P_{ADC}(G_{nom})$,
$P2=P(G_{nom}+\Delta G)$, for example $P2=P_{ADC}(G_{nom}+\Delta G)$,
P1 and P2 being expressed in dB.

Preferably, an intermodulation is detected if the following inequation is verified:

$$P2-P1 > \Delta G + 3 \text{ dB} \tag{2}$$

with $P1=P(G_{nom})$, for example $P1=P_{ADC}(G_{nom})$,
$P2=P(G_{nom}+\Delta G)$, for example $P2=P_{ADC}(G_{nom}+\Delta G)$,
P1 and P2 being expressed in dB.

The gain increase $\Delta G$ is preferably of short duration so as to disrupt the signal delivered at the output of the reception device 10 as little as possible. The gain increase $\Delta G$ is for example a gain pulse having a short duration, such as a duration of less than 100 µs, preferably substantially equal to 50 µs.

The gain increase $\Delta G$ is preferably greater than the default value of the gain G. The gain increase $\Delta G$ depends on an amplitude of the received radio signal and a maximum amplitude of the signal before saturation of the electronic reception device 10, in particular before saturation of the analog to digital converter 24. The amplitude of the gain increase $\Delta G$ is for example equal to the difference between said maximum amplitude before saturation and the amplitude of the received radio signal.

The control module 16 is configured to repetitively command the generation of the gain increase $\Delta G$.

Those skilled in the art will understand that "repetitively" refers to a reiteration at successive time intervals, the repetitive generation of the gain increase $\Delta G$ preferably being substantially periodic, for example with a periodicity substantially equal to 1 ms, as long as no modulation has been detected and as long as the gain of the upstream amplifier 14 is smaller than the maximum predefined upstream gain $G_{max}$.

In addition, the control module 16 is configured to increase the time gap between a new gain increase $\Delta G_{n+1}$ generated at a moment in time $t_{n+1}$ and a last gain increase $\Delta G_n$ generated at a moment in time $t_n$ in case of detection of an intermodulation following the last gain increase $\Delta G_n$. In other words, if an intermodulation is detected, the control module 16 is then configured to space the next gain increase $\Delta G_{n+1}$ out in time relative to the last gain increase $\Delta G_n$ having caused the detection of this intermodulation. This makes it possible to limit any oscillations of the effective signal, and to prevent the intermodulation detection from causing a disruption of the signal delivered at the output of the reception device 10.

The time gap between two successive gain increases $\Delta G_n$, $\Delta G_{n+1}$ between the moments in time $t_n$ and $t_{n+1}$ is for example substantially equal to 1 ms if no intermodulation has been detected after the last gain increase $\Delta G_n$ and if the gain G of the upstream amplifier 14 is smaller than a predefined upstream maximum gain $G_{max}$.

If an intermodulation has been detected after the last gain increase $\Delta G_n$, then the time gap is between the moment in time $t_n$ of generation of the last gain increase $\Delta G_n$ and the moment in time $t_{n+1}$ of generation of the next gain increase $\Delta G_{n+1}$ is for example substantially equal to 20 ms.

If the gain G of the upstream amplifier 14 is substantially equal to the predefined upstream maximum gain $G_{max}$, then the time gap between two successive moments in time $t_n$, $t_{n+1}$ of successive gain increases $\Delta G_n$, $\Delta G_{n+1}$ is greater than that following an intermodulation detection, and is for example substantially equal to 50 ms.

In other words, to perform an intermodulation detection, the control module 16 is configured to increase over a short duration, and preferably repetitively, the upstream amplification gain and next to measure the power increase on the signal coming from the mixer 18. If the power increases is in the same order as the amplification variation, that is to say, if the variation of the power of the signal coming from the mixer as a function of the variation of the gain is substantially linear, then the control module 16 considers that the reception device 10 is not in an intermodulation situation. On the contrary, if the power increase is much higher than the gain variation of the upstream amplification, the control module 16 considers that an intermodulation is present.

The control module 16 is further configured to apply or not apply setpoints coming from the first wideband detector 26, and as an optional addition, from the second wideband detector 28, as a function of whether an intermodulation is detected. More specifically, if the control module 16 considers that no intermodulation is present, then it is configured to ignore the setpoints coming from the wideband detector(s) 26, 28. Otherwise, if the control module 16 considers that an intermodulation is present, it is then configured to apply each gain modification setpoint coming from the wideband detector(s) 26, 28.

As an optional addition, the control module 16 is further configured, prior to the intermodulation detection, to perform a presence test of at least one adjacent stray signal, for example of at least one strong adjacent signal. The control module 16 is then configured to perform the intermodulation detection only if the presence test is positive, that is to say, if at least one stray adjacent signal is considered to be present, said presence test depending on the power of the signal at the output of the mixer 18 and the gain G of the upstream amplifier 14.

The presence test is for example positive if the gain G of the upstream amplifier is smaller than the predefined upstream maximum gain $G_{max}$, preferably much smaller than said predefined upstream maximum gain $G_{max}$, and if the power of the signal at the output of the mixer 18, for example measured by the analog to digital converter 24, is strictly lower than a predefined target power $P_c$. The presence test is negative if the aforementioned conditions are not met.

Gain much smaller than said predefined upstream maximum gain $G_{max}$ for example refers to a gain at least 2 dB smaller than said predefined upstream maximum gain $G_{max}$.

Power lower than the predefined target power $P_c$ for example refers to a power 2 dB below said target power $P_c$.

The determination of the predefined target power $P_c$ is known in itself, and the predefined target power $P_c$ is for example determined as a function of the waveform to be demodulated and also of a PAPR (Peak to Average Power Ratio) of the waveform in order to have the dynamic maximum at the analog to digital converter 24 without causing saturation.

As an optional addition, in particular if the reception device further comprises the downstream amplifier 22 connected at the output of the mixer 18, the presence test of at least one stray adjacent signal further depends on a gain F of the downstream amplifier 22.

According to this optional addition, the presence test is for example positive if the power of the signal at the output of the mixer 18 is below the predefined target power $P_c$ and if the gain G of the upstream amplifier 14 is below the predefined upstream maximum gain $G_{max}$ and further if the gain $\Gamma$ of the downstream amplifier 22 is substantially equal to a predefined downstream maximum gain $\Gamma_{max}$.

The choice of the predefined upstream maximum gain $G_{max}$, and if applicable of the predefined downstream maximum gain $\Gamma_{max}$, are known in themselves. Each predefined maximum gain $G_{max}$, $\Gamma_{max}$ is dependent on the concerned amplifier, and is qualified on the reception device 10. For example, for a silicon tuner, the predefined upstream maximum gain $G_{max}$ is substantially equal to 40 dB, the predefined downstream maximum gain $\Gamma_{max}$ is substantially equal to 25 dB.

The mixer 18 is known in itself and is configured to mix the signal coming from the upstream amplifier 14—called effective signal—with the reference signal, for example by multiplying these two signals, the voltage of the signal at the output of the mixer then being the product of the voltage of the effective signal and the voltage of the reference signal.

The reference signal is typically a non-modulated signal, for example a signal coming from the local oscillator 20, and the mixer 18 is then connected to the local oscillator 20.

The local oscillator 20 is able to supply the reference signal, such as the non-modulated signal, this non-modulated signal making it possible, via the mixer 18, to transpose the effective signal to an intermediate frequency.

The downstream amplifier 22 is known in itself, and is suitable for amplifying the signal coming from the mixer 18.

The analog to digital converter 24 is connected at the output of the downstream amplifier 22 when it is present, or directly at the output of the mixer 18 in the absence of downstream amplifier, and is configured to convert the analog signal coming from the mixer 18, optionally amplified by the downstream amplifier 22, into a digital signal.

As an optional addition, the analog to digital converter 24 is further configured to measure the power of the signal coming from the mixer 18, in particular the first power P1 in the absence of gain increase, then the second power P2 in the presence of the gain increase $\Delta G$.

Each wideband detector 26, 28 is known in itself, and is capable of regulating the amplification done by the upstream amplifier 14 by measuring the power of the signal coming from the upstream amplifier 14 for the first wideband detector 26, or even by measuring the power of the signal coming from the radio antenna 12 for the second wideband detector 28 when it is present, and by generating a gain setpoint in order to regulate the power if the measured power is outside a range of predefined powers. In other words, each wideband detector 26, 28 seeks to prevent an excessive amplification of the radio signal by the upstream amplifier 14, and more generally to limit the introduction by the upstream amplifier 14 of a nonlinearity on the received signal.

Figure 2:
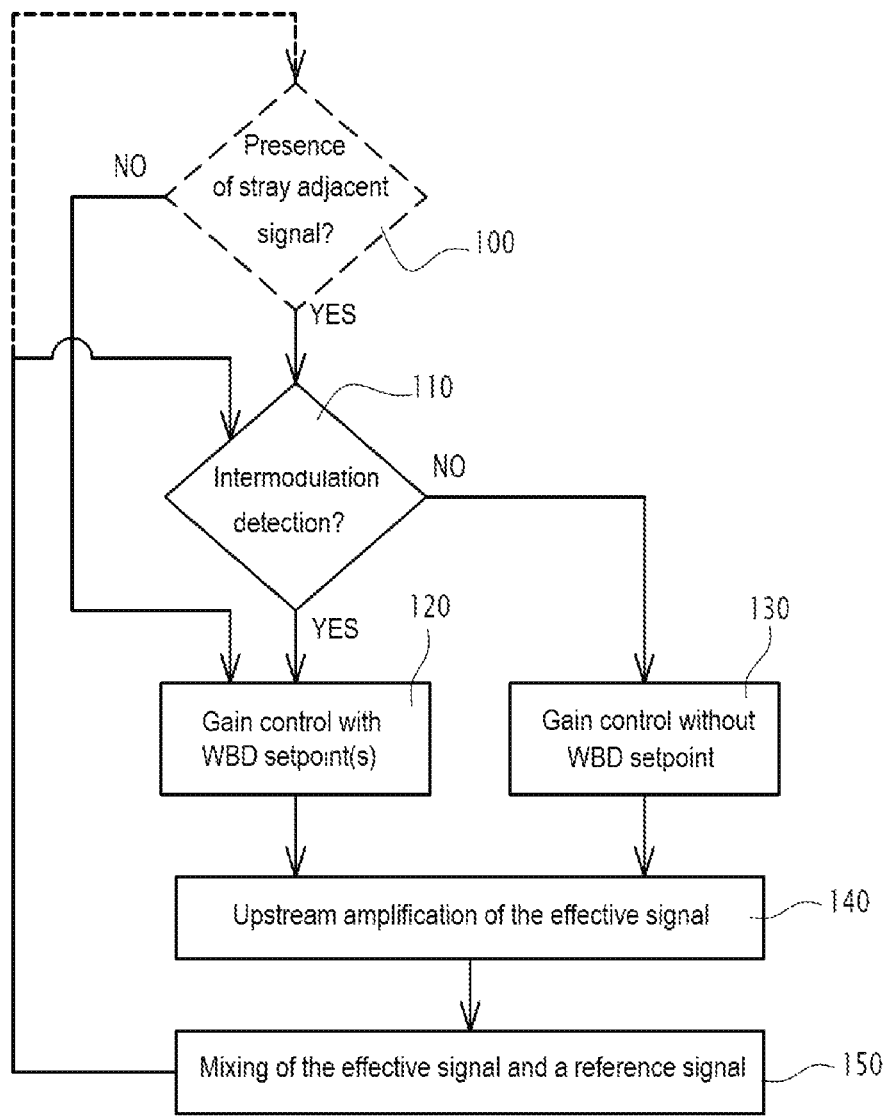
FIG. 2 is a flowchart of a method for receiving a radio signal according to an embodiment of the invention, the method being carried out by the reception device of FIG. 1.

The operation of the electronic reception device 10 will now be explained using FIG. 2, showing a flowchart of the method according to an embodiment of the invention for receiving a radio signal.

During an optional initial step 100, the reception device 10 performs, via its control module 16, a presence test for at least one stray adjacent signal from the power of the signal at the output of the mixer 18 and the gain G of the upstream amplifier 14, or further from the gain Γ of the downstream amplifier 22.

The presence test is for example positive if the gain G of the upstream amplifier 14 is much lower than the predefined upstream maximum gain $G_{max}$ and if the power of the signal at the output of the mixer 18 is strictly lower than the predefined target power $P_c$, the presence test being negative otherwise.

In a variant, the presence test is positive if the gain G of the upstream amplifier 14 is smaller than the predefined upstream maximum gain $G_{max}$, and if the gain Γ of the downstream amplifier 22 is substantially equal to the predefined downstream maximum gain $Γ_{max}$, and further if the power of the signal at the output of the mixer 18 is lower than the predefined target power $P_c$, the presence test being negative otherwise.

If the presence test done in the initial step 100 is positive, the reception device 10 goes to the following step 110 during which it performs, via its control module 16, a detection of any intermodulation. This intermodulation detection includes the generation, by the upstream amplifier 14, of the gain increase ΔG, then the comparison of the first and second powers P1, P2 of the signal coming from the mixer 18, the first power P1 being measured in the absence of gain increase and the second power P2 being measured in the presence of the gain increase ΔG.

During this step 110, the control module 16 then considers that an intermodulation is present when the variation of the power P of the signal at the output of the mixer 18, corresponding to the difference between the second power P2 and the first power P1, is nonlinear relative to the gain increase ΔG, typically if the difference between the second power P2 and the first power P1 is greater than substantially 1.5 times the gain increase ΔG. As an example, if the power variation P2-P1 verifies inequation (1) or (2), then the control module 16 considers that an intermodulation 16 is present. Otherwise, that is to say, if the power variation P2-P1 is substantially linear relative to the gain increase ΔG, for example if inequations (1) or (2) are not verified, then the control module 16 considers that no intermodulation is detected.

If the intermodulation detection done during step 110 is positive, that is to say, if the control module 16 considers that an intermodulation is present, then the reception device 10 goes to step 120, during which the control module 16 controls the gain G of the upstream amplifier 14 while taking account of any modification setpoints of the gain G coming from the wideband detector(s) 26, 28.

Otherwise, if the intermodulation detection is negative, that is to say, if the control module 16 considers during step 110 that no intermodulation is present, then the reception device 10 goes to step 130, during which the control module 16 controls the gain G of the upstream amplifier 14 while ignoring any setpoints coming from the wideband detector(s) 26, 28.

If, at the end of the initial and optional step 100 for testing for the presence of at least one stray adjacent signal, the test is negative, that is to say, if no stray adjacent signal is detected, then the reception device 10 goes directly from step 100 to step 120 for controlling the gain to account for any modification setpoints of the gain G coming from the wideband detector(s) 26, 28.

Those skilled in the art will of course understand that when the reception device 10 does not perform the optional initial step 100, it then begins the reception method directly in step 110.

At the end of step 120 for controlling the gain with taking account of WBD setpoint(s) or at the end of step 130 for controlling the gain without taking account of WBD setpoint(s), the reception device 10 amplifies, during step 140, the radio signal received via its upstream amplifier 14.

The reception device 10 mixes, during step 150, the signal coming from the upstream amplifier 14, called effective signal, with the reference signal, preferably non-modulated, via its mixer 18, and the analog signal coming from the mixer 18 is next converted into the digital signal by the analog to digital converter 24.

This digital signal converted by the analog to digital converter 24 corresponds to the signal supplied at the output of the reception device 10. The signal thus converted by the analog to digital converter 24 is next typically digitally filtered, resampled if needed (adaptation of the sampling frequency in the case of digital signals), and demodulated by a receiver placed at the output of the reception device. The demodulated signal then becomes an audio and/or video signal intended to be reproduced by a third-party device (car radio, TV, etc.).

The reception method next returns to step 100 or step 110 depending on whether the optional initial step 100 is done, in order to perform the reception of a new radio signal.

Thus, the electronic reception device 10 makes it possible to perform, more simply and via the control module 16, a detection of a potential intermodulation, by commanding the generation by the upstream amplifier 14 of the gain increase ΔG, then observing whether the power variation of the signal coming from the mixer 18, resulting from this gain increase ΔG, is a substantially linear variation, or on the contrary a nonlinear variation, relative to the generated gain increase ΔG. An intermodulation is then considered to be present, if the power variation P2-P1 of the signal at the output of the mixer 18 is nonlinear relative to the gain increase ΔG. In a correlated manner, no intermodulation is considered to be present, if the variation in power P2-P1 is substantially linear relative to the generated gain increase ΔG.

The generation by the upstream amplifier 14 of the gain increase ΔG is preferably controlled repetitively by the control module 16 in order to perform this intermodulation detection at successive time intervals.

The time gap between two successive generation moments $t_n$, $t_{n+1}$ of two successive gain increases $ΔG_n$, $ΔG_{n+1}$ further preferably depends on whether an intermodulation is detected following the last gain increase $ΔG_n$ and the value of the gain G of the upstream amplifier 14 relative to the predefined upstream maximum gain $G_{max}$, which makes it possible to limit the risk of introduction of any oscillations due to this intermodulation detection, and which would then potentially disrupt the signal delivered at the output of the reception device 10.

The generation of the gain increase ΔG is then for example commanded periodically with a relatively low temporal periodicity, typically with a time period substantially equal to 1 ms, only if no intermodulation has been detected after the last gain increase $\Delta G_n$ and if the gain G of the upstream amplifier 14 is smaller than the predefined upstream maximum gain $G_{max}$. Otherwise, if the gain G of the upstream amplifier 14 is substantially equal to the predefined upstream maximum gain $G_{max}$, then the time gap between a next gain increase $\Delta G_{n+1}$ and the previous gain increase $\Delta G_n$ is significantly increased, typically equal to 50 ms. Similarly, if an intermodulation has been detected after the last gain increase $\Delta G_n$, then the time gap between the next gain increase $\Delta G_{n+1}$ and the last gain increase $\Delta G_n$ is also increased, this increase, however, being smaller, the time gap then typically being substantially equal to 20 ms, than in the case where the gain G of the upstream amplifier 14 is substantially equal to the predefined upstream maximum gain $G_{max}$.

Performing, as an optional addition, a presence test of at least one stray adjacent signal, such as at least one strong adjacent signal, further makes it possible to perform the intermodulation detection only if the latter is necessary. Indeed, if no stray adjacent signal is detected, it is then not necessary next to perform an intermodulation detection, and the reception method then goes directly in this case from step 100 to step 120.

One can thus see that the electronic reception device 10 makes it possible to perform the detection of any intermodulation more simply than with an electronic reception device of the state of the art.

The invention claimed is:

1. An electronic device for processing a radio signal, the device comprising:
   an upstream amplifier configured to amplify a received radio signal,
   a control module configured to control a gain of the upstream amplifier, and
   a mixer, connected at an output of the upstream amplifier, the mixer being configured to mix the signal from the upstream amplifier with a reference signal,
   the control module being further configured to perform an intermodulation detection, by commanding the generation by the upstream amplifier of a gain increase and comparing a first power with a second power, the first and second powers being respective powers of a signal at the output of the mixer, the first power being measured in the absence of the gain increase and the second power being measured in the presence of the gain increase, wherein the control module is configured to repetitively command the generation of the gain increase, and wherein the time gap between a new gain increase and the last gain increase is increased in case of detection of an intermodulation after the last gain increase.

2. The device according to claim 1, wherein an intermodulation is detected if a difference between the second power and the first power is greater than substantially 1.5 times the gain increase.

3. The device according to claim 1, wherein the time gap between two successive gain increases is substantially equal to 1 ms if no intermodulation has been detected after the last gain increase and if the gain of the upstream amplifier is smaller than a predefined upstream maximum gain.

4. The device according to claim 1, wherein the device further comprises a downstream amplifier connected at the output of the mixer and an analog to digital converter connected at the output of the downstream amplifier.

5. The device according to claim 4, wherein the analog to digital converter is configured to measure the first and second powers.

6. The device according to claim 1, wherein the control module is further configured, prior to an intermodulation detection, to perform a presence test of at least one adjacent stray signal, and then to perform the intermodulation detection only if the presence test is positive, said presence test depending on the power of the signal at the output of the mixer and the gain of the upstream amplifier.

7. The device according to claim 6, wherein the presence test is positive if the gain of the upstream amplifier is below a predefined upstream maximum gain and if the power of the signal at the output of the mixer is strictly lower than a predefined target power.

8. The device according to claim 6, wherein the device further comprises a downstream amplifier connected at the output of the mixer and an analog to digital converter connected at the output of the downstream amplifier; and wherein the presence test further depends on a gain of the downstream amplifier.

9. The device according to claim 8, wherein the presence test is positive if the gain of the upstream amplifier is below a predefined upstream maximum gain, if the gain of the downstream amplifier is substantially equal to a predefined downstream maximum gain and if the power of the signal at the output of the mixer is below a predefined target power.

10. The device according to claim 1, wherein the device further comprises a first wideband detector connected between the output of the upstream amplifier and the control module.

11. The device according to claim 1, wherein the device further comprises a radio antenna able to receive a radio signal, and a second wideband detector connected between the radio antenna and the control module.

12. An integrated circuit implementing an electronic device for receiving a radio signal, wherein the device is according to claim 1.

13. A method for processing a radio signal, the method being implemented by an electronic reception device and comprising:
   controlling a gain of an upstream amplifier,
   amplifying, via the upstream amplifier, a received radio signal,
   mixing the signal from the upstream amplifier with a reference signal, and
   performing an intermodulation detection, by commanding the generation by the upstream amplifier of a gain increase and comparing a first power with a second power, the first and second powers being respective powers of a signal at the output of the mixer, the first power being measured in the absence of the gain increase and the second power being measured in the presence of the gain increase, wherein the electronic reception device is configured to repetitively command the generation of the gain increase, and wherein the time gap between a new gain increase and the last gain increase is increased in case of detection of an intermodulation after the last gain increase.

* * * * *